US006842728B2

(12) United States Patent
Gooding et al.

(10) Patent No.: US 6,842,728 B2
(45) Date of Patent: Jan. 11, 2005

(54) TIME-MULTIPLEXING DATA BETWEEN ASYNCHRONOUS CLOCK DOMAINS WITHIN CYCLE SIMULATION AND EMULATION ENVIRONMENTS

(75) Inventors: Thomas Michael Gooding, Rochester, MN (US); Roy Glenn Musselman, Rochester, MN (US); Robert N Newshutz, Rochester, MN (US); Jeffrey Joseph Ruedinger, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 813 days.

(21) Appl. No.: 09/804,210

(22) Filed: Mar. 12, 2001

(65) Prior Publication Data

US 2002/0128812 A1 Sep. 12, 2002

(51) Int. Cl.[7] .............................................. G06F 9/455
(52) U.S. Cl. ........................... 703/23; 702/125; 703/16; 703/19; 703/20; 703/23; 703/25; 703/27; 712/29; 712/35; 712/203; 712/206; 712/223; 712/245; 713/400; 716/6; 716/16
(58) Field of Search ........................................... 703/28

(56) References Cited

U.S. PATENT DOCUMENTS

| 5,596,742 | A | * | 1/1997 | Agarwal et al. ............... 716/16 |
| 5,649,167 | A | * | 7/1997 | Chen et al. ..................... 703/23 |
| 5,649,176 | A | * | 7/1997 | Selvidge et al. ............. 713/400 |
| 5,659,716 | A | * | 8/1997 | Selvidge et al. ............... 703/23 |
| 5,680,583 | A | * | 10/1997 | Kuijsten ........................ 703/23 |
| 5,802,348 | A | * | 9/1998 | Stewart et al. ................. 703/25 |
| 5,838,954 | A | * | 11/1998 | Trimberger ................... 716/16 |
| 5,923,865 | A | * | 7/1999 | Chilton et al. ................ 703/23 |
| 6,408,324 | B1 | * | 6/2002 | Wallace et al. ............. 718/107 |
| 6,430,593 | B1 | * | 8/2002 | Lindsley ...................... 718/103 |

OTHER PUBLICATIONS

"Quickturn's CoBALT Plus Sets New Levels in Emulation Capacity and Co–Simulation Speed" What's New Quick Turn Designs Inc. Nov. 1998. www.quickturn.com.*
"Cycle–based Simulation" Technology, QuickTurn Designs Inc. Nov. 1998. www.quickturn.com/tech/cbs.htm. Feb. 2001.*
"Technology: In Circuit Emulation" Technology QuickTurn Designs Inc. Nov. 1998. www.quickturn.com/tech/emulation.htm Feb. 2001.*

(List continued on next page.)

Primary Examiner—Kevin J. Teska
Assistant Examiner—Thomas H. Stevens
(74) Attorney, Agent, or Firm—Wood, Herron & Evans, LLP

(57) ABSTRACT

An apparatus and method utilize a buffer interposed in a common signal path between asynchronous clock domains in a hardware-based logic emulation environment to manage the communication of time-multiplexed data signals between the clock domains during hardware-based emulation. The buffer is effectively used to latch each data signal communicated across the common signal path so that the clock domain that receives the signals can retrieve each such signal at appropriate points in the receiver clock domain's evaluation cycle. Independently-controlled write/read pointers are maintained in a buffer control circuit to independently address the buffer for the transmitter and receiver sides of an asynchronous communication path. Locations in the buffer are associated with specific steps in the evaluation cycles of each of the transmitter and receiver clock domains, and the write/read pointers are managed to respectively write and read data to and from the locations in the buffer based upon the current evaluation steps being performed within the respective evaluation cycles of the transmitter and receiver clock domains.

24 Claims, 3 Drawing Sheets

OTHER PUBLICATIONS

"CoBALT Plus Brochure" Products QuickTurn Designs Inc. www.quickturn.com/products/products/cobaltplus–brochure.htm Feb. 2001.*

"CoBALT Plus" Technical Data Sheet, Products, QuickTurn Designs Inc. Nov. 1998. www.quickturn.com/products/coblatplus_data_sheet_.htm Feb. 2001.*

Micropax™ Connector System, FCI, www.fciconnect.com Framatome Connectors International. S.A. (2000).*

"Cycle–Based Simulation", *Technology,* Quickturn Design Systems, Inc., www.quickturn.com/tech/cbs.htm, downloaded (Feb. 13, 2001).

"Technology: In Circuit Emulation", *Technology,* Quickturn Design Systems, Inc., www.quickturn.com/tech/emulation.htm, downloaded (Feb. 13, 2001).

"CoBALT$^{Plus}$ Brochure", *Products,* Quickturn Design Systems, Inc., www.quickturn.com/products/cobaltplus–brochure.htm, downloaded (Feb. 13, 2001).

"CoBALT$^{Plus}$ Technical Data Sheet", *Products,* Quickturn Design Systems Inc., www.quickturn.com/products/coblatplus_data_sheet.htm, downloaded (Feb. 13, 2001).

"Micropax™ Connector System",, FCI, www.fciconnect.com, Framatome Connectors International, S.A., (2000).

* cited by examiner

FIG. 3

TIME-MULTIPLEXING DATA BETWEEN ASYNCHRONOUS CLOCK DOMAINS WITHIN CYCLE SIMULATION AND EMULATION ENVIRONMENTS

FIELD OF THE INVENTION

The invention is generally related to simulation and emulation of integrated and other electronic circuit designs. More specifically, the invention is generally related to the communication of data within a hardware-based cycle simulation or emulation environment.

BACKGROUND OF THE INVENTION

As semiconductor fabrication technology advances, designers of integrated circuits and electronic circuits incorporating the same are able to integrate more and more functions into individual integrated circuit devices, or chips. As such, electronic designs that once required several integrated circuits electrically coupled to one another on a circuit board or module may now be integrated into fewer integrated circuits, thereby increasing performance and reducing cost.

With increases in circuit complexity, however, the processes of designing and testing circuit designs become increasingly complex and time consuming. As a result, computers have become increasingly important in automating the design and testing of circuit designs.

An important step in the development of a complex electronic system is that of verification, which is used to verify the functional operation of a circuit design. Traditionally, hardware circuit designs have been designed on a computer at a relatively high level of abstraction, typically in a hardware definition language such as VHDL or Verilog. Software tools, known as compilers, are then used to generate simulation models for the designs that can be executed on a logic simulator computer program to simulate the reactions of such circuit designs to various input conditions. By simulating the functional operation of a circuit design, potential errors or faulty logic can be identified and corrected in the high level design. Simulation is then rerun until the circuit design functions as desired.

However, with the increasingly complex nature of many circuit designs, software-based simulation is often too time consuming and inefficient. As a result, a significant amount of development effort has been directed toward hardware-based verification environments such as cycle simulators and logic emulators (hereinafter jointly referred to as "hardware-based emulators"). Both cycle simulation and logic emulation of a circuit design are often performed using a massively parallel hardware-based emulator incorporating hundreds or thousands of "emulation processors" that are used to emulate, in hardware, the various functional components of a circuit design. The emulation processors can be specifically designed to efficiently emulate various functional components, and thus permit the emulation of potentially millions of logic gates in substantially less time than would be required for software-based simulation.

Cycle simulation, for example, is used to verify the functionality of a circuit design by calculating the outputs of circuit components at clock edges, with typically only two logic states (binary 1 and 0) computed for each component output.

Related to cycle simulation is in-circuit logic emulation, which verifies the operation of a circuit design within an overall electronic system. For example, in-circuit logic emulation may be used to verify the proper interaction between a circuit design and a real-world target hardware system with which the eventually-manufactured product will operate. Moreover, in-circuit logic emulation may be used to verify a hardware circuit design running custom software, a process known as "coverification". Thus, with in-circuit logic emulation, system-wide integration, testing and verification can be substantially simplified.

One exemplary type of hardware-based emulation environment is the ET3.5 emulation system from International Business Machines Corporation. The ET3.5 system includes potentially thousands of emulation processors distributed among multiple interconnected logic boards, with each logic board including sixty-five processor chips, and with each processor chip including sixty-four emulation processors. Emulation processors can individually emulate hundreds of logic gates, thereby permitting millions of logic gates to be emulated at any given time.

With a hardware-based emulator, a logic design to be emulated is typically in the form of a gate-level model that has been compiled from a high-level language. The compiled model breaks up each clock cycle (also referred to as an evaluation cycle) into a series of evaluation "steps". The evaluation steps are typically executed in-order on each emulation processor, and are repeated during each evaluation cycle.

Given the highly parallel nature of most circuit designs, the ability to communicate information between emulation processors during logic emulation is often extremely important for accurately and efficiently verifying a logic design. To support such inter-processor communication in the ET3.5 system, for example, each processor chip is connected to a pair of connectors capable of interfacing the chip with other chips disposed on the same or different logic boards within the system. Each processor on the chip has a dedicated input pin (XBI) and output pin (XBO), and thus thirty-two processors use each connector. Processors are capable of reading and writing to their respective XBI/XBO pins during any evaluation step, and as a result, it is possible to time-multiplex multiple data signals between two chips using the XBI/XBO pins.

While the use of the aforementioned connectors between processor chips often provides adequate connectivity between processors, the interconnection mechanism is typically not capable of supporting asynchronous communications between processors with the same degree of connection density.

Asynchronous communications, for example, are required in a logic system whenever two electronic components are operating on different system clocks. All of the logic in a circuit design that operates under the same clock is typically referred to as a "clock domain." Particularly in circuit designs incorporating multiple logic boards, as well as in designs that interface with target hardware systems, it is common for multiple clock domains to be utilized. While many logic emulators support the ability to emulate multiple clock domains, communicating signals between clock domains is problematic, since the receiver of an asynchronous signal has no clock relationship to the source, and thus cannot decode time-multiplexed data over a given signal path. As a result, conventional logic emulators have required that no more than one signal be communicated over a particular signal path between asynchronous clock domains. Otherwise, time-multiplexed signals could be misinterpreted and cause the generation of incorrect emulation results.

When only a few sets of signals are communicated between asynchronous clock domains in a circuit design, the limitation of one signal per signal path is not particularly burdensome. However, in many complex systems, thousands of signals may be required to be passed between asynchronous clock domains. With conventional logic emulators such as the aforementioned ET3.5 system, it has been found that tens or hundreds of cables may be required to communicate all necessary data between asynchronous clock domains. In many instances, these cables are very expensive, thus adding significant cost to a hardware-based emulation system. In addition, the more cables in a system, the more difficult the system is to administer, and the greater likelihood that a cable may fail or not be connected properly. Furthermore, connectivity limitations may decrease the number of logic gates that may be emulated in a given system, thus requiring a more complex, and thus more expensive, system to adequately emulate a particular design.

Therefore, a significant need continues to exist in the art for a manner of facilitating the communication of data signals between asynchronous clock domains in a hardware-based emulation environment. In particular, a need has existed for overcoming the limitation against time-multiplexing data across signal paths between asynchronous clock domains during emulation and/or simulation of a circuit design.

SUMMARY OF THE INVENTION

The invention addresses these and other problems associated with the prior art by providing an apparatus and method that utilize a buffer interposed in a common signal path between asynchronous clock domains in a hardware-based emulation environment to manage the communication of time-multiplexed data signals between the asynchronous clock domains during hardware-based emulation. The buffer is effectively used to latch each data signal communicated across the common signal path so that the clock domain that receives the signals can retrieve each such signal at appropriate points in the receiver clock domain's evaluation cycle.

In the illustrated embodiments, independently-controlled write/read pointers are typically maintained in a buffer control circuit to independently address the buffer for the transmitter and receiver sides of an asynchronous communication path. Locations in the buffer are associated with specific steps in the evaluation cycles of each of the transmitter and receiver clock domains, and the write/read pointers are managed to respectively write and read data to and from the locations in the buffer based upon the current evaluation steps being performed within the respective evaluation cycles of the transmitter and receiver clock domains.

As such, time-multiplexed data that is transmitted by a transmitter clock domain can be effectively routed and decoded by a receiver clock domain over the course of the receiver clock domain's evaluation cycle, thereby substantially increasing the signal-carrying capacity of the signal path. As a result, the cabling requirements between asynchronous clock domains may be substantially reduced, thus increasing system reliability and simplicity, and decreasing costs.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

BRIEF DESCRIPTION OF THE DRAWINGS

FIG. 3 is a table illustrating an exemplary communication of time-multiplexed data between asynchronous clock domains using the hardware-based emulation system of FIG. 1.

DETAILED DESCRIPTION

Figure 1:
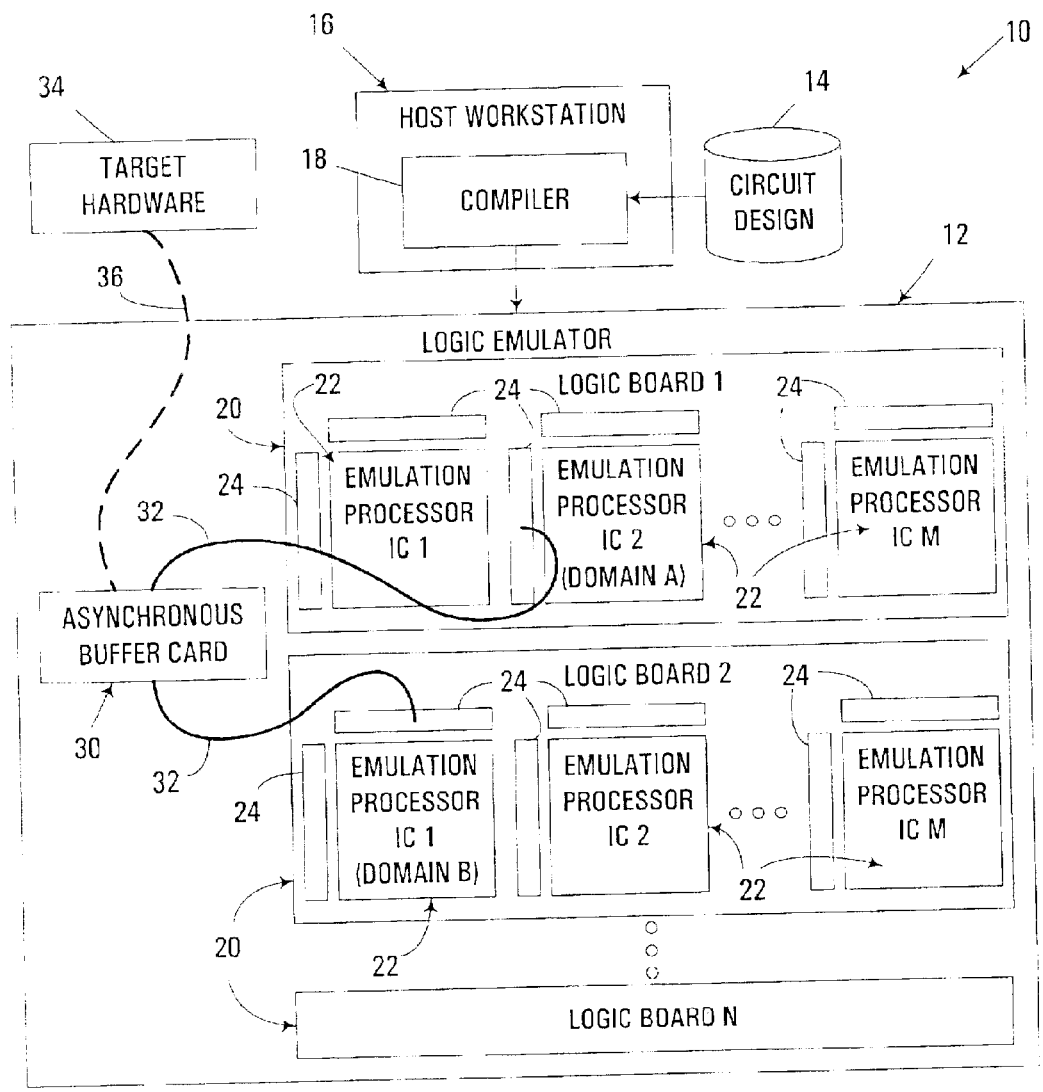
FIG. 1 is a block diagram of a hardware-based emulation system incorporating an asynchronous buffer card consistent with the invention.

Turning to the Drawings, wherein like numbers denote like parts throughout the several views, FIG. 1 illustrates a hardware-based logic emulation system 10 consistent with the invention. System 10 includes a hardware-based logic emulator 12, which is used to emulate a circuit design stored in a database 14. The circuit design is typically designed and modeled in a high-level hardware definition language such as Verilog or VHDL. The logic emulator 12 operates on a gate-level compiled model of the circuit design, which may be generated, for example, on a host workstation 16 that executes a compiler 18. The host workstation may also be used to design or perform other Electronic Design Automation (EDA) steps during the development, testing, verification and/or validation of a circuit design.

Logic emulator 12 may be based upon any number of suitable hardware-based logic emulation or simulation environments, e.g., the ET3.5 emulation environment from International Business Machines Corporation. Typically, logic emulator 12 includes a plurality of logic boards 20, each of which including a plurality of emulation processor chips 22. Moreover, each chip 22 typically includes a plurality of emulation processors for emulating a compiled circuit design model. In the ET3.5 environment, for example, each emulation processor chip includes sixty-four emulation processors, with each logic board including 65 emulation processor chips disposed thereon. It will be appreciated, however, that other hardware-based logic emulator architectures may be used in the alternative.

Inter-processor communication in logic emulator 12 is typically handled by a plurality of connectors 24 interfaced with chips 22. In the illustrated embodiment, for example, Micropax connectors from Berg Electronics may be utilized to interface emulation processor chips with one another. Each chip 22 includes a pair of Micropax connectors, each connector including sixty-four signal pins, with thirty-two designated as input pins and thirty-two designated as output pins. Thus, with the pair of connectors allocated to each chip, each emulation processor on a chip is allocated one input pin (designated XBI) and one output pin (designated XBO) between the pair of connectors for the chip. For synchronous communications, Micropax cables are typically routed between connectors associated with different chips. Typically, the connectors are routed between different logic boards, although chips located on the same logic board may also be interfaced in the same manner. Moreover, the connectors may be interconnected with other types of electronic components within logic emulator 12, e.g., memory boards, input/output boards, data capture boards, etc.

As discussed above, for synchronous communications, the use of direct cables between chips may permit multiple data signals to be transmitted over common signal paths in a Micropax cable using time-multiplexing, given that both the receiver and transmitter chip are running in the same clock domain. Circuit designs that execute within the same clock domain are typically compiled at the same time, and include the same number of emulation evaluation steps per evaluation cycle. Thus, so long as the number of signals that need to be transmitted between two chips within a given evaluation cycle is less than the total number of evaluation steps, one signal path may be used to transmit all of the signals each evaluation cycle. In certain instances, more data than is allowed by the number of evaluation steps may need to be transmitted, whereby it may be desirable to allocate more than one pin to a particular processor on a given chip.

However, for asynchronous communications, where processors on different chips are emulated in different clock domains, time-multiplexed communications over a single signal path using a direct cable is often not possible, particularly if the respective clock domains utilize different numbers of evaluation steps per evaluation cycle. This is based upon the fact that if the clock domains have different evaluation steps, it would not be possible at the receiver end to be certain which step data is being sent over a single signal path. In addition, the start of execution of evaluation steps may occur at different times if the domains are each synchronized to independently running target systems.

To address this limitation with conventional logic emulators, an asynchronous buffer card 30 is interposed between chips 22 that reside in separate clock domains (e.g., clock domains A and B illustrated in FIG. 1). The asynchronous buffer card may be coupled to each chip via Micropax compatible cables, or in the alternative, the buffer card may include a Micropax connector for a daughter board-type connection to one of the Micropax connectors associated with a chip, with a Micropax-compatible cable utilized to interface the buffer card with another chip. The respective connections 32 are disposed between buffer card 30 and chips 22 are illustrated at 32, and should be considered to be capable of being implemented as cables, connectors, and other forms of interconnects known in the art. The buffer card may be utilized to interface chips on the same logic board, or on separate logic boards, consistent with the invention. Further, the buffer and buffer control circuitry may not be disposed on a card, but may be disposed in other components, and may be integrated with other components (e.g., in a target system, in a processor chip, on a logic board, etc.).

Moreover, as illustrated by target hardware block 34, it may also be desirable to utilize an asynchronous buffer card to interface a chip with a target hardware system, e.g., for in-circuit logic emulation. As a result, rather than interfacing two emulation processor chips to one another, an emulation processor chip may be interfaced with a real-world hardware system with which the emulated circuit design is being interfaced. The interconnection 36 between target hardware 34 and buffer card 30 may be via a cable or other interconnect, or in the alternative, the functionality of card 30 may be incorporated into the external hardware device, and connected to the logic emulator via suitable Micropax-compatible cabling.

It will be appreciated that other logic emulators and emulation systems may be utilized in the alternative. Moreover, the principles of the invention may apply to either or both of cycle simulation and in-circuit logic emulation, or a system may be capable of addressing both types of verification environments. For this reason, the generic terminology "emulation" is used hereinafter to refer to both cycle simulation and logic emulation.

Moreover, different logic emulator architectures may be used in the alternative, with the partitioning of emulation processors among chips and boards differing from that illustrated in FIG. 1. Furthermore, additional electronic components, e.g., I/O cards, memory, data capture cards, etc., may also be incorporated into logic emulator 12 consistent with the invention. Furthermore, other interconnects between emulation processors, as well as connectors other than Micropax connectors, may also be used in the alternative. Thus, the invention is not limited to the particular environment discussed herein.

Figure 2:
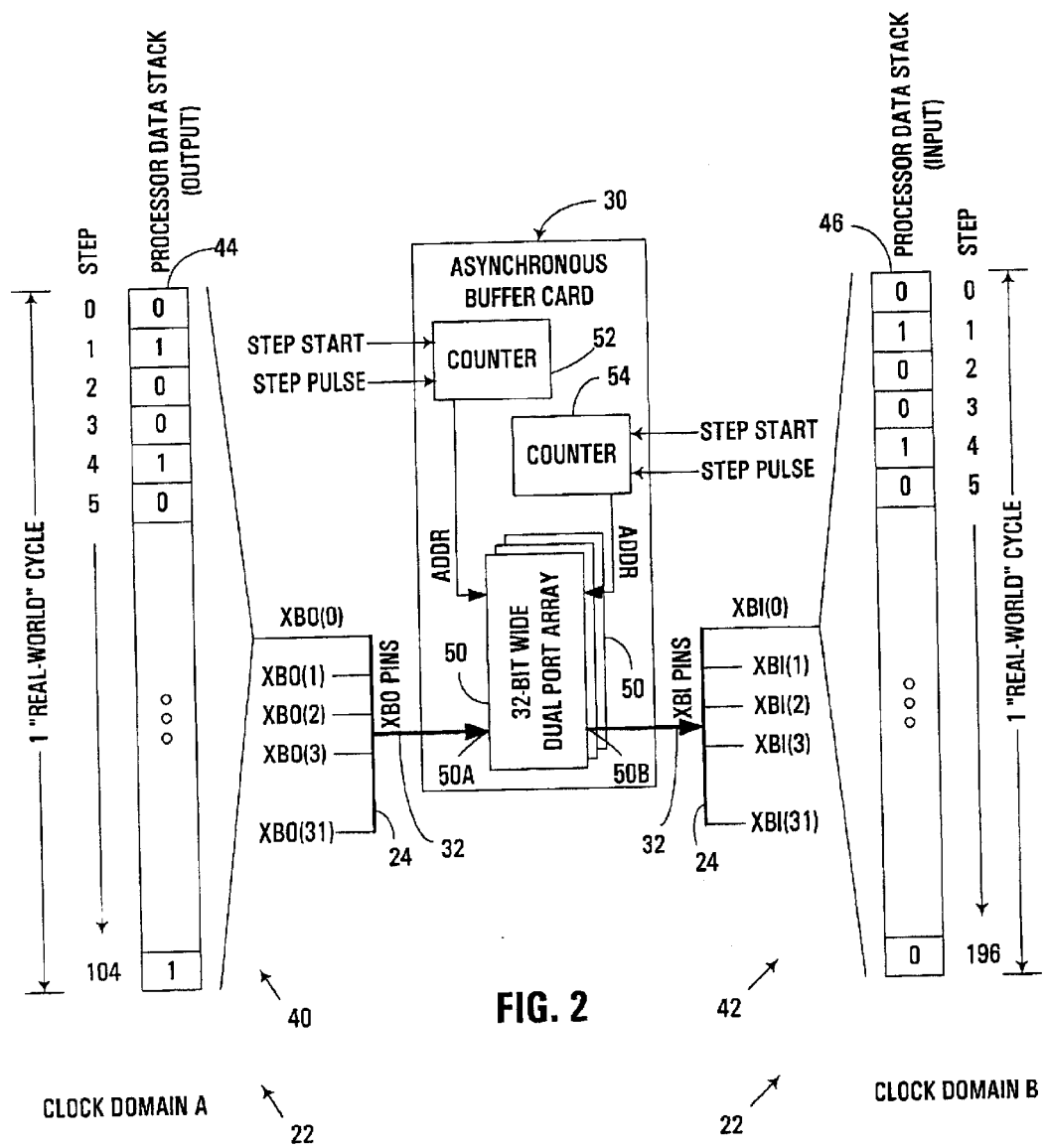
FIG. 2 is a block diagram of the asynchronous buffer card of FIG. 1, shown interfaced with emulation processor chips from a pair of asynchronous clock domains.

Asynchronous buffer card 30 is illustrated in greater detail in FIG. 2. In particular, a unidirectional communication pathway in buffer card 30 is illustrated, and is suitable for transmitting data generated by a processor 40 in clock domain A, to a processor 42 in clock domain B. It will be appreciated that corresponding circuitry for communicating from clock domain B to clock domain A may also be used in the alternative. Moreover, card 30 may include multiple connectors to interface multiple emulation processor chips to one another, including environments where more than two clock domains are used.

Typically, when a multi-clock domain hardware design is compiled, the separate clock domains are compiled into separate models. At compile time, the compiler typically determines which value will be output or input by a processor at what step in an evaluation cycle. To support time-multiplexing of signals across a given signal path between clock domains, therefore, each processor on each chip 22 typically includes a processor data stack including one or both of an output stack and an input stack (e.g., output stack 44 for processor 40 and input stack 46 for processor 42). Each slot in the associated stack 44, 46 is associated with a particular step in an evaluation cycle. For example, it may be desirable to provide up to 256 steps in an evaluation cycle, whereby each stack 44, 46 would include a maximum of 256 slots for each processor on the chip.

FIG. 2 illustrates, as an example, the interface between a pair of processors 40, 42 located in clock domains A and B, where the first processor 40 is coupled to an XBO(0) pin on connector 24 for its chip 22, with processor 42 in clock domain B coupled to the corresponding XBI(0) pin on the respective connector 24 on its chip 22. The XBO and XBI pins for the other processors on each chip 22 are designated as XBO(1–31) and XBI(1–31). These processors are not shown separately in FIG. 2.

As an example of the use of separate compiled models, FIG. 2 also illustrates that the circuit design in clock domain A is modeled using 105 evaluation steps, while the circuit design modeled in clock domain B includes 197 evaluation steps. The total number of steps in an evaluation cycle corresponds to one real-world clock cycle for the model, and the number of steps can vary for different circuit design models.

Thus, during each cycle of a logic emulation process, processor 40 in clock domain A outputs up to 105 data signals to stack 44, while processor 42 in clock domain B reads the contents of the input stack 46 during its respective 197 evaluation steps.

If the processors 40, 42 in clock domain A and clock domain B were within the same clock domain and therefore used the same number of evaluation steps per real-world cycle, the contents of output stack 44 could be simply asserted on the XBO(0) signal path defined between the chips, with the asserted XBO(0) pin connected directly to the XBI(0) pin on the other chip, so that the value stored in any slot in output stack 44 is fed directly to the corresponding input slot in input stack 46.

For asynchronous communications, however, asynchronous buffer card 30 is interposed into the signal path between the matching XBO and XBI pins on the respective connectors 24 of the chips 22 in clock domains A and B. To provide such an interface, a dual port memory array, buffer or discrete bank of registers (for the case of multiplexing on one end and discrete signals on the other end (e.g., a target system)) 50 is interposed between the XBO pins and XBI pins, with the interconnects 32 between connectors 24 being coupled to data in (write) 50A and data out (read) 50B ports on the dual port array. Thus, it may be seen that the XBO/XBI connection represents a common signal path through which time-multiplexed signals may be communicated by a transmitter with the clock domain buffer 50 interposed in that path to latch the signals for later capture by the receiver clock domain.

In the illustrated embodiment, 32 XBO pins are implemented on a particular connector 24, as are 32 XBI pins on the other connector for a chip. Thus, to latch the 32 pins in a unidirectional communication, buffer 50 is 32 bits in width, with each of the 32 bits mapped to a particular XBO/XBI set of pins.

In the illustrated embodiment, a multi-port array such as a dual port array is utilized for buffer 50 to permit concurrent reads and writes to the buffer. Addressing of read and write operations is managed by a pair of counters 52, 54, which respectively operate as write and read control circuits, and which are respectively driven by the associated clock domains at the output and input sides of the signal path. In the illustrated embodiment, each clock domain provides a step pulse for the respective clock domain during each step of an evaluation cycle. Moreover, since each clock domain may include a different number of evaluation steps, a step start signal is provided to each counter 52, 54 to reset the counter at the beginning of each evaluation cycle.

With this configuration, therefore, read and write pointers into the dual port array 50 are independently managed by the respective clock domains. This effectively creates a latch for each time-multiplexed signal over a particular XBO/XBI signal path, which keeps the value stable at all times so the receiver can access it whenever appropriate.

As shown in FIG. 2, multiple arrays 50 may be used in a buffer. For example, a second array may be used for the complementary transmissions from processor 42 to processor 40. Otherwise, other arrays may be used to support additional communication signal paths between the chips, or between additional chips and/or target systems. For a complementary array, counter 54 could be used to drive the write pointer for the complementary array, with counter 52 driving the read pointer on behalf of the complementary array.

Figure 3:
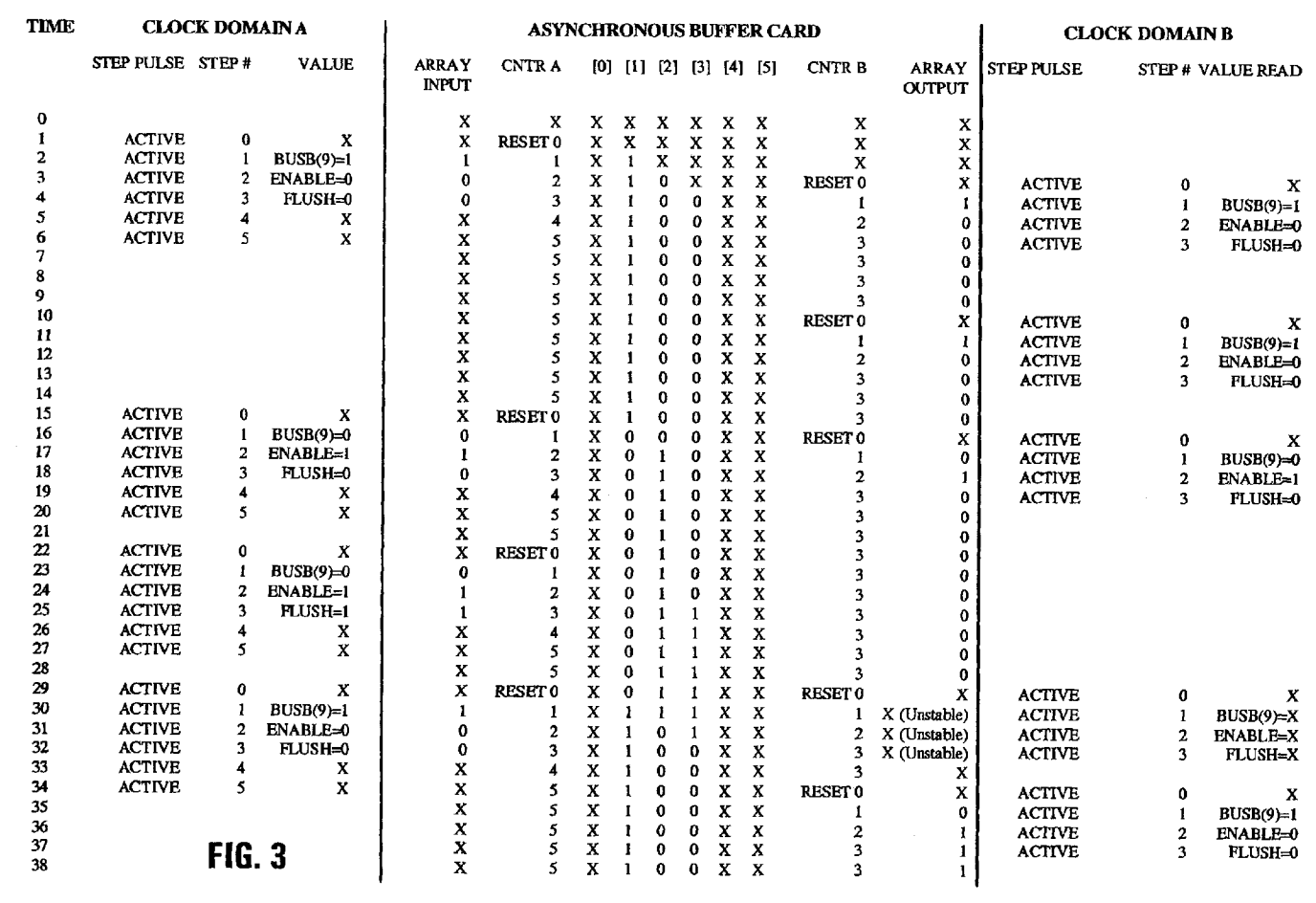

Next, FIG. 3 illustrates an exemplary emulation operation between a pair of clock domains "A" and "B" using the asynchronous buffer card of FIG. 2. In this example, clock domain A includes six evaluation steps per evaluation cycle, while clock domain B takes four evaluation steps per real-world clock cycle. It also assumes that data is being transmitted from clock domain A to clock domain B across a one-bit wide common signal path, with a one-bit signal BUSB(9) being transmitted in step 1, and with one-bit ENABLE and FLUSH signals being transmitted during steps 2 and 3 of each evaluation cycle. FIG. 3 illustrates, for clock domain A, the time in units of evaluation steps, whether or not the step pulse signal is active, the current step in an evaluation cycle, and the value output on the XBO pin for the transmitting processor (a value of "X" is a don't-care). Likewise, for clock domain B, the status of the step pulse line, the step number, and the value read (i.e, the value asserted on the corresponding XBI pin), are shown.

For the asynchronous buffer card, the values asserted at the array input and output (i.e., the data in and data out lines to the array) are illustrated, as are the contents of six locations in the array, designated [0]–[5]. Moreover, the current value stored in the counters associated with clock domain A and clock domain B (counters 52 and 54) are also displayed, as is the indication of a counter reset in association with the values of "0" for each counter. (It is assumed for this example that any time a step start signal is asserted, the appropriate counter will go to a value of "0".)

Generation of the step start and step pulse signals may be performed in a number of manners consistent with the invention. For example, the step pulse signal may be generated from a FastCLK signal generated by the appropriate clock domain. The FastCLK signal, which may be provided on the connector, may be used to indicate whether data is currently being evaluated. By incrementing the counter each time the FastCLK signal is asserted, the counter will be incremented each evaluation step. Other signals, e.g., provided via other connections than the connectors 24, may be used in the alternative.

The step start signal may be generated, for example, from a DSTEP signal, which is asserted at the beginning of an evaluation cycle. In the alternative, an MSTEP signal provided by the logic emulator via an external cable may be used. The use of an MSTEP signal is described, for example in U.S. Ser. No. 09/523,053 by Cook et al., filed on Mar. 10, 2000, the disclosure of which is incorporated by reference herein. This signal asserts itself at the start of an evaluation cycle and deasserts at the end of an evaluation cycle. In the alternative, virtual logic compiled into a compiler model may be used to manage a dedicated pin that will tell the buffer card to reset its write/read pointers to step 0.

To review FIG. 3. First, times 7–14 and 20–28 reflect respective pauses during the emulation of clock domains A and B, and illustrate the fact that in the case of a pause in clock domain A, the same data will be read from the XBI pin on successive evaluation cycles in clock domain B (e.g., at times 3–6 and 10–14). Likewise, a pause in clock domain B will result in the data asserted on the XBO pin by clock domain A during one cycle (times 22–28) being discarded before being read.

Moreover, as illustrated at times 29–33, a potential unstable condition may be signaled when it is determined that the transmitter and receiver are attempting to read and write into the buffer at the same time—resulting in a potentially unstable output. Indication of an unstable condition may be performed, for example, via a separate signal path or another condition on the signal path (e.g., a tri-state condition). Detection and reporting of an unstable condition is useful for debugging purposes; however, correction of the condition is typically not desirable since such a condition could occur in the real world system.

It may therefore be seen that reliable communications may be performed between asynchronous clock domains regardless of the relative clock frequency or alignment of the two clock domains.

Various modifications may be made to the illustrated embodiments without departing from the spirit and scope of the invention. For example, a slower step pulse may be derived off a higher frequency step pulse to meet timing constraints of logic on the asynchronous buffer card. Effectively, data could be transferred every nth step pulse. Moreover, other manners of resetting a buffer card's write/read pointers may be used, as may other sources for generating the step pulse and step start signals. Moreover, returning to FIG. 2, it will be appreciated that multiple buffers 50 may be provided on an asynchronous buffer card, e.g,. one for each direction of communication between clock domain A and clock domain B. In the alternative, a unified array may be utilized to support bi-directional communication over a given signal path.

As another alternative, it is not necessary for a signal that is output by one clock domain on a certain evaluation step be read on the corresponding evaluation step for the other clock domain, e.g., through the use of a field programmable interconnect device (FPID) or other device to perform step-address translation at the receiver end. Thus, for example, a signal output by clock domain A during evaluation step 3 for the domain A evaluation cycle could be read by clock domain B during evaluation step 7 for the domain B evaluation cycle. Further, it is not necessary for locations (addresses) in the buffer be directly mapped to corresponding evaluation steps. Thus, for example, the signal output by clock domain A during evaluation step 5 could be stored in the 3rd location in the buffer. Data, as well as a location in the buffer, is associated with an evaluation step when there is a set mapping that exists, despite the fact that the mapping is non-linear or non-monotonic.

In addition, while signals are illustrated as being one-bit binary signals, a signal and signal path (and thus a stack and buffer) may have varying binary widths. As another alternative, multiple read ports could be provided with independent control of multiple read pointers, to support multiple receiver clock domains, e.g., as in a broadcasting environment where an asynchronous signal is passed to multiple receivers.

Other modifications will be apparent to one of ordinary skill in the art. Therefore, the invention lies in the claims hereinafter appended.

What is claimed is:

1. A circuit arrangement for use in communicating multiple signals over a common signal path between first and second clock domains during hardware-based logic emulation, wherein the first clock domain is emulated via a first multi-step evaluation cycle and the second domain is emulated via a second multi-step evaluation cycle, the circuit arrangement comprising:

(a) a buffer interposed in a common signal path between first and second clock domains, the buffer including first and second locations, the first location associated with a first evaluation step in the first multi-step evaluation cycle and a first evaluation step in the second multi-step evaluation cycle, and the second location associated with a second evaluation step in the first multi-step evaluation cycle and a second evaluation step in the second multi-step evaluation cycle; and (b) logic circuitry coupled to the buffer, the logic circuitry configured to store in the first location of the buffer a first time-multiplexed signal output over the common signal path by the first clock domain during the first evaluation step in the first multi-step evaluation cycle, and to store in the second location of the buffer a second time-multiplexed signal output over the common signal path by the first clock domain during the second evaluation step in the first multi-step evaluation cycle, the logic circuit further configured to output the first time-multiplexed signal stored in the first location over the common signal path to the second clock domain during the first evaluation step in the second multi-step evaluation cycle, and to output the second time-multiplexed signal stored in the second location over the common signal path to the second clock domain during the second evaluation step in the second multi-step evaluation cycle.

2. The circuit arrangement of claim 1, wherein the buffer comprises a multi-port array including a write port and a read port, and wherein the logic circuitry comprises a write control circuit and a read control circuit respectively coupled to the write port and read port of the multi-port array, the write control circuit configured to control storage of signals from the first clock domain in the multi-port array, and the read control circuit configured to control output of signals from the multi-port array to the second clock domain.

3. The circuit arrangement of claim 2, wherein each of the write and read control circuits includes a counter.

4. The circuit arrangement of claim 3, wherein the counter in the write control circuit is configured to be incremented during each evaluation step in the first multi-step evaluation cycle, and wherein the counter in the read control circuit is configured to be incremented during each evaluation step in the second multi-step evaluation cycle.

5. The circuit arrangement of claim 4, wherein the counter in the write control circuit is configured to be reset for each first multi-step evaluation cycle, and wherein the counter in the read control circuit is configured to be reset for each second multi-step evaluation cycle.

6. The circuit arrangement of claim 4, wherein the counter in the first multi-step evaluation cycle maintains a current evaluation step number for the first clock domain, wherein the counter in the second multi-step evaluation cycle maintains a current evaluation step number for the second clock domain, wherein the read and write control circuits are each configured to use the respective current evaluation step numbers stored in the respective counters to address the multi-port array.

7. The circuit arrangement of claim 1, wherein the first and second multi-step evaluation cycles have different numbers of evaluation steps from one another.

8. The circuit arrangement of claim 1, wherein the buffer is further interposed within a second common signal path between the first and second clock domains, and wherein the logic circuitry is further configured to store in the buffer time-multiplexed signals output over the second common signal path by the first clock domain concurrently with storing time-multiplexed signals output over the first common signal path, and to output over the second common signal path from the buffer to the second clock domain, the time-multiplexed signals stored in the buffer.

9. The circuit arrangement of claim 1, wherein the first and second locations are each a plurality of bits wide, wherein the buffer is interposed within a multi-bit common signal path between the first and second clock domains, and wherein the logic circuitry is further configured to stored in the buffer multi-bit time-multiplexed signals output over the multi-bit common signal path by the first clock domain, and to output over the multi-bit common signal path from the buffer to the second clock domain, the multi-bit time-multiplexed signals stored in the buffer.

10. A logic board comprising the circuit arrangement of claim 9.

11. A logic emulator comprising the circuit arrangement of claim 9.

12. The logic emulator of claim 11, further comprising a plurality of emulation processor integrated circuit devices, at least one of the emulation processor integrated circuit devices configured to emulate the first clock domain, and at least one other of the emulation processor integrated circuit devices configured to emulate the second clock domain.

13. The logic emulator of claim 12, further comprising a plurality of logic boards, each including a subset of the plurality of emulation processors, and wherein the common signal path extends between emulation processors disposed on different logic boards.

14. A circuit arrangement for use in communicating multiple signals over a common signal path between first and second clock domains during hardware-based logic emulation, wherein the first clock domain is emulated using a first multi-step evaluation cycle and the second domain is emulated using a second multi-step evaluation cycle, the circuit arrangement comprising:

(a) a buffer interposed between the first and second clock domains within the common signal path, the buffer including a plurality of locations, each of which associated with an evaluation step from each of the first and second multi-step evaluation cycles;

(b) a write control circuit responsive to a first step signal associated with a current evaluation step in the first multi-step evaluation cycle, the write control circuit configured to store a signal output over the common signal path by the first clock domain in a location in the buffer that is associated with the current evaluation step in the first multi-step evaluation cycle; and (c) a read control circuit responsive to a second step signal associated with a current evaluation step in the second multi-step evaluation cycle, the read control circuit configured to output a signal stored in a location in the buffer that is associated with the current evaluation step in the second multi-step evaluation cycle.

15. The circuit arrangement of claim 14, wherein the buffer comprises a multi-port array including a write port coupled to the write control circuit and a read port coupled to the read control circuit, wherein the write control circuit includes a counter configured to be incremented in response to the first step signal, and wherein the read control circuit includes a counter configured to be incremented in response to the second step signal.

16. The circuit arrangement of claim 15, wherein the counter in the write control circuit is configured to be reset for each first multi-step evaluation cycle, and wherein the counter in the read control circuit is configured to be reset for each second multi-step evaluation cycle.

17. The circuit arrangement of claim 15, wherein the counter in the first multi-step evaluation cycle maintains a current evaluation step number for the first clock domain, wherein the counter in the second multi-step evaluation cycle maintains a current evaluation step number for the second clock domain, wherein the read and write control circuits are each configured to use the respective current evaluation step numbers stored in the respective counters to address the multi-port array.

18. The circuit arrangement of claim 14, wherein the first and second multi-step evaluation cycles have different numbers of evaluation steps from one another.

19. A method of communicating multiple signals over a common signal path between first and second clock domains during hardware-based logic emulation, the method comprising:

(a) during each of a first plurality of evaluation steps in an evaluation cycle for the first clock domain, communicating a signal associated with such evaluation step across the common signal path from the first clock domain to a buffer that has a plurality of locations, and storing the communicated signal in a location among the plurality of locations in the buffer that is associated with such evaluation step; and (b) during each of a second plurality of evaluation steps in an evaluation cycle for the second clock domain, wherein each of the second plurality of evaluation steps is associated with a location among the plurality of locations, communicating a signal from the location in the buffer that is associated with such evaluation step from the second plurality of evaluation steps to the second clock domain.

20. The method of claim 19, wherein communicating the signal associated with each evaluation step in the evaluation cycle for the first clock domain includes incrementing a first counter for each such evaluation step, and wherein communicating the signal from the location associated with each evaluation step in the evaluation cycle for the second clock domain includes incrementing a second counter for each such evaluation step.

21. The method of claim 20, further comprising resetting the first counter for each evaluation cycle for the first clock domain, and resetting the second counter for each evaluation cycle for the second clock domain.

22. A method of communicating multiple signals over a common signal path between first and second clock domains during hardware-based logic emulation, wherein the first clock domain is emulated via a first multi-step evaluation cycle that includes first and second evaluation steps and the second domain is emulated via a second multi-step evaluation cycle that includes first and second evaluation steps, the method comprising:

(a) during the first evaluation step in the first multi-step evaluation cycle, receiving a first time-multiplexed signal output over the common signal path by the first clock domain and storing the first time-multiplexed signal in a first location in a buffer interposed in the common signal path, wherein the first location is associated with the first evaluation step in the first multi-step evaluation cycle and the first evaluation step in the second multi-step evaluation cycle;

(b) during the second evaluation step in the first multi-step evaluation cycle, receiving a second time-multiplexed signal output over the common signal path by the first clock domain and storing the second time-multiplexed signal in a second location in the buffer, wherein the second location is associated with the second evaluation step in the first multi-step evaluation cycle and the second evaluation step in the second multi-step evaluation cycle;

(c) during the first evaluation step in the second multi-step evaluation cycle, communicating the first time-multiplexed signal stored in the first location over the common signal path to the second clock domain; and (d) during the second evaluation step in the second multi-step evaluation cycle, communicating the second time-multiplexed signal stored in the second location over the common signal path to the second clock domain.

23. The method of claim 22, wherein the buffer comprises a multi-port array including a write port and a read port, the method further comprising incrementing a first counter for each evaluation step in the first multi-step evaluation cycle, incrementing a second counter for each evaluation step in the second multi-step evaluation cycle, and utilizing the first and second counters to respectively address the write and read ports of the multi-port array.

24. The method of claim 20, further comprising resetting the first counter for each first multi-step evaluation cycle, and resetting the second counter for each second multi-step evaluation cycle.

* * * * *